United States Patent [19]

Brownell

[11] Patent Number: 5,427,086
[45] Date of Patent: Jun. 27, 1995

[54] FORCED AIR FURNACE HAVING A THERMOELECTRIC GENERATOR FOR PROVIDING CONTINUOUS OPERATION DURING AN ELECTRIC POWER OUTAGE

[75] Inventor: David L. Brownell, Medway, Mass.

[73] Assignee: Rochester Gas and Electric Co., Rochester, N.Y.

[21] Appl. No.: 96,916

[22] Filed: Jul. 26, 1993

[51] Int. Cl.⁶ .............................................. F24H 3/02
[52] U.S. Cl. ........................... 126/110 R; 126/110 E; 126/116 A; 136/205
[58] Field of Search ............ 126/110 R, 110 E, 116 R, 126/116 A; 136/205

[56] References Cited

U.S. PATENT DOCUMENTS

| | | | |
|---|---|---|---|
| 2,362,258 | 11/1944 | Findley | 126/110 |
| 2,362,259 | 11/1944 | Findley | 126/110 E |
| 2,501,627 | 3/1950 | Findley | 126/116 A |
| 2,884,762 | 5/1959 | Lindenblad | 62/3 |
| 2,962,218 | 11/1960 | Dibert | 126/110 R |
| 3,150,656 | 9/1964 | Huber | 126/110 E |
| 3,185,201 | 5/1965 | Herbst et al. | 126/110 E |
| 3,627,588 | 12/1971 | Rubinstein et al. | 136/205 |
| 3,719,532 | 3/1973 | Falkenberg | 136/208 |
| 3,759,244 | 9/1973 | Konet | 126/110 E |
| 3,881,962 | 5/1975 | Rubinstein | 136/209 |
| 4,080,221 | 3/1978 | Manelas | 136/248 |
| 4,125,122 | 11/1978 | Stachurski | 136/205 |
| 4,218,266 | 8/1980 | Guazzoni et al. | 136/209 |
| 4,276,440 | 6/1981 | Cannelli | 136/206 |
| 4,306,426 | 12/1981 | Berthet et al. | 62/3 |
| 4,520,305 | 5/1985 | Cauchy | 322/2 |
| 4,702,225 | 10/1987 | Heffernan | 126/116 R |
| 4,734,139 | 3/1988 | Shakum et al. | 136/210 |
| 4,773,847 | 9/1988 | Shukla et al. | 431/46 |
| 4,942,863 | 7/1990 | Chou et al. | 126/110 |
| 5,060,722 | 10/1991 | Zdenek et al. | 126/110 R |
| 5,062,409 | 11/1991 | Kamanaka et al. | 126/110 R |

Primary Examiner—Carroll B. Dority
Attorney, Agent, or Firm—M. Lukacher

[57] ABSTRACT

An uninterruptible gas-fired forced hot air furnace utilizes a thermoelectric generator in the path of the hot combusted gas to a heat exchanger. The combusted gas (combustion products) flows through the pipes of the heat exchanger to an exhaust which may lead to the chimney, or direct vent, in the building in which the furnace is located. The thermoelectric generator is also in the path of the forced cold air which also goes to the heat exchanger. The cold air thus picks up heat in the process of cooling the cold junctions of the thermoelectric generator and picks up more heat in the heat exchanger from the combustion products before being ducted into the heating system. The thermoelectric generator cold junctions may be air-cooled by fins connected thereto through which the stream of air from the blower passes or the cold junctions may be cooled by liquid which is circulated through a liquid-to-air heat exchanger. In both cases the air from the blower of the furnace first picks up heat from the thermoelectric generator and then from the air cooled heat exchanger. The thermoelectric generator provides electric power which may be used to operate the motor which drives the blower and also to charge a battery which is used when the furnace is started up. In the event that the power is interrupted, as occurs during storms or fault conditions in the public utility power distribution system, the furnace continues to run uninterruptedly.

7 Claims, 5 Drawing Sheets

FORCED AIR FURNACE HAVING A THERMOELECTRIC GENERATOR FOR PROVIDING CONTINUOUS OPERATION DURING AN ELECTRIC POWER OUTAGE

The present invention relates to forced air furnaces having means for thermoelectrically generating electric power to maintain the furnace in operation continuously in spite of power outages thereby enabling maintenance of comfortable conditions through severe weather-related and other power outages.

The invention is especially suitable for providing a gas-fired, uninterruptible residential furnace or to retrofit existing gas-fired furnaces so as to make them tolerant of electrical faults (power outages) external of the furnace.

Thermoelectrics have been used in gas-powered water heaters and space heaters, primarily to operate the low-power control systems associated with these heaters and furnaces. There have also been attempts to self-power gas-fired furnaces through the use of closed cycle steam turbine systems. Proposals for the incorporation of thermoelectric generators in heating apparatus have been made from time to time ever since alloy thermoelectric materials, particularly semiconductors, have been produced. For example, U.S. Pat. No. 2,362,258 issued Nov. 7, 1944 shows a space heater with a thermoelectric generator heated by combustion gases on the inside thereof while cooled by air from a blower which is forced across the outside thereof. The air which is heated in passing over the thermoelectric generator is used for space heating. Once the combustion products pass through the thermoelectric generator and serve their purpose for generating electricity which can run the blower, they are discharged to the flue and not further utilized.

In the design of such heating apparatus as described above, the thermoelectric (T/E) generator utilized heat energy needed for heating purposes and diminished the efficiency of the heating system as a whole. More particularly, such known T/E devices convert only about 5% of the heat passing through the device into electric power, the remaining 95% is rejected at the cold junction. Also, the 5% converted to electric power is eventually dissipated as motor/blower heat losses. Accordingly, although thermoelectrically generated electrical current could operate the motors as well as the controls of the furnace continuously and did not need to rely upon outside electrical power sources, furnaces with thermoelectric-generating capability have not been practically useful.

Accordingly it is the principal object of the present invention to provide an improved forced air furnace having thermoelectric generation capabilities employed in a manner to provide practical overall heating efficiency as well as uninterrupted operation.

It is another object of the invention to provide an improved hot air gas-fired heating system especially for residential space heating that can provide heat even when external electric power is not available.

It is a still further object of the present invention to provide an improved forced air furnace, which is of the type sometimes called a forced-draft warm-air furnace, and which is capable of being retrofitted with thermoelectric generating capabilities.

It is a still further object of the invention to provide an improved gas-fired forced hot air furnace with T/E electric power generating facilities which can be placed outside the building air plenum.

It is a more specific object of the present invention to provide a self-powered forced hot air furnace which may use either a finned (air-cooled) or liquid-cooled thermoelectric generator together with an air-to-air type heat exchanger. After picking up heat from the thermoelectric generator, the forced air, which is provided in an air stream from a blower, picks up additional heat from the air-to-air heat exchanger and is delivered to the building air stream. The fuel, preferably gas, produces gaseous combustion products which are passed through the thermoelectric generator and thence through the air-to-air heat exchanger. Aside from the energy extracted from the burning of the fuel to produce electricity and the flue gas exhausted from the air-to-air heat exchanger, the remaining heat energy is transferred to the forced air stream from the blower to the building air where it heats the building. The thermoelectric generator also provides electric current which is used via control and inverter systems to power the blower, charge a battery for standby and start-up operation of the furnace and to operate appliances which must be continuously operated, such as refrigerators, freezers and sump pumps.

The foregoing and other objects features and advantages of the invention as well as presently preferred embodiments thereof will become more apparent from a reading of the following description in connection with the accompanying drawings in which.

Figure 1:
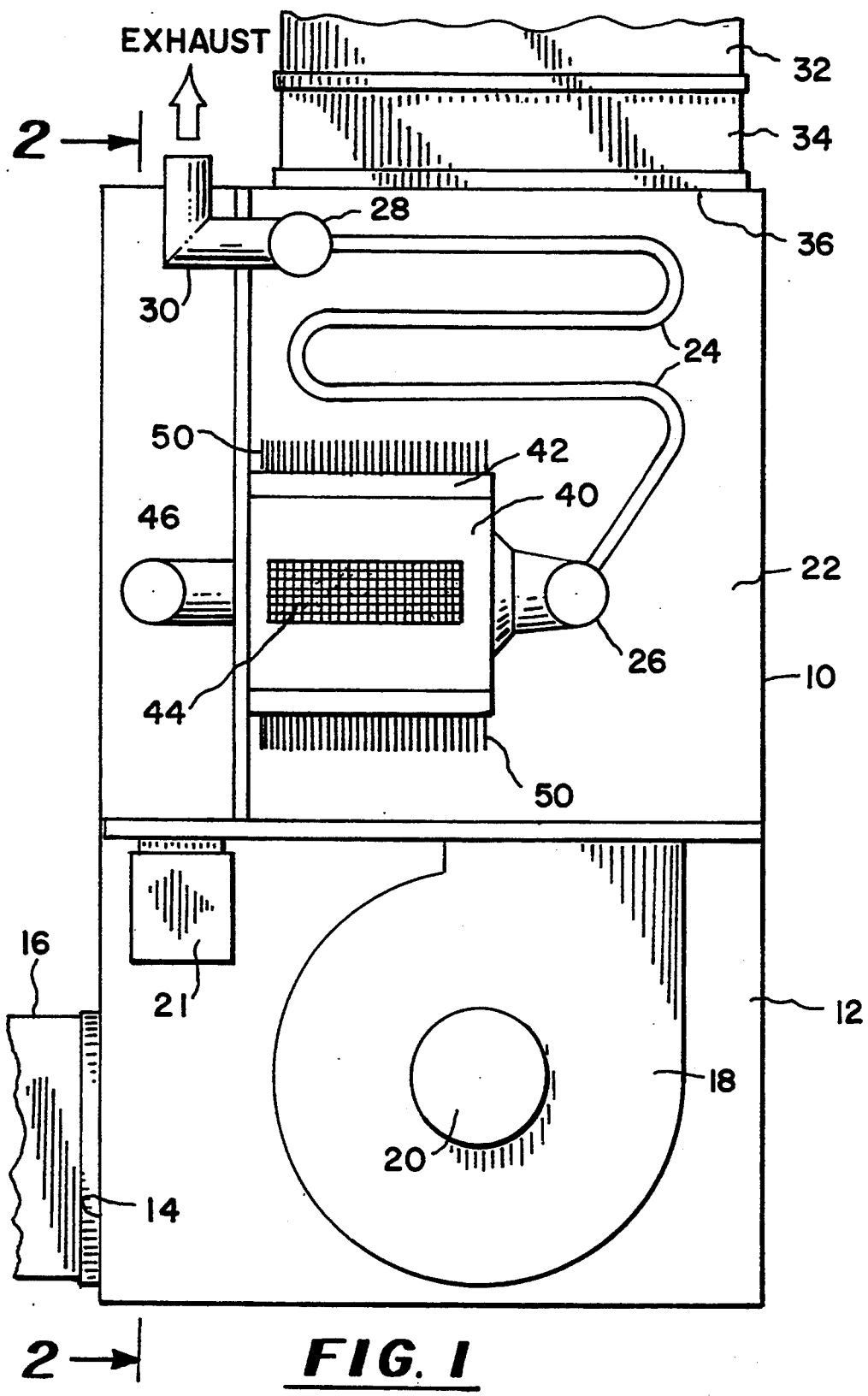
FIG. 1 is a side view, with the side panel of its housing removed, of a gas-fired hot air furnace (also known as a forced draft warm air furnace) which embodies the invention.

Referring to FIG. 1 there is shown a housing 10 of a hot air furnace which is generally conventional in that it utilizes a blower chamber 12 having an opening 14 to which the return duct 16 of the forced air heating system of the building in which the furnace is installed is connected.

The furnace has a blower 18 driven by a blower motor 20. The blower provides a stream of air (cold air) into a upper or heating chamber 22. This chamber has an air-to-air heat exchanger 24 made up of an array of serpentine pipes connected between inlet and outlet manifolds 26 and 28. The air-to-air heat exchanger may also be of the more conventional "clam shell" style, composed of many parallel flat plates separating combustion products from the building air. The outlet manifold is connected via an exhaust pipe 30 to the flue which is connected to the chimney of the building equipped with the furnace. The heating chamber has a main duct 32 connected via a coupling 34 to the top of the chamber across an opening 36 through which the stream of forced air from the blower passes. This provides the heated building air. Spaced between the blower 18 and the heat exchanger 24, is a region in the chamber 22 where a thermoelectric generator 40 is mounted. This thermoelectric generator has power leads which are connected via the electrical system shown in FIG. 5 to the blower motor 20. In a preferred design the blower motor is a high efficiency electronically commutated motor known as an "ECM." Such motors are available from the General Electric Company in the United States.

The thermoelectric generator 40 may be of conventional design. It is a cylindrical shape and has an annular axial passage 42 in which a screen burner 44 is disposed. The passage is connected to a gas input pipe 46. This is a mono-port burner having a single firing port which has the advantage of not producing significant $NO_x$ emissions. Other single port burners, such as radiant burners may be used. In the burner, the gas and air from an air intake 48 form combustion products (gases) which are convectively driven through the heat exchanger 24.

The cold side junctions of the generator 40 are connected to a heat exchanger provided by an array of metal fins 50 in the form of rings or spine fins around the generator 40. These fins are in the air stream from the blower 18 so that cool air from the blower cools the cold junction side of the generator and provides the temperature differential requisite for electrical current generation. The excess heat is delivered to the air stream from the blower by a primary air-to-air heat exchanger afforded by the aluminum fins 50. This heated air is then further heated in the air-to-air heat exchanger 24. High efficiency is maintained because of the dual use of the thermoelectric generator as a electrical current generator and as a heat exchanger which converts the heat in the gaseous combustion products into electricity as well as into heated air. Further heat is extracted from these combustion products in the air-to-air heat exchanger 24. In a typical application for a 100,000 BTU per hour furnace 40,000 BTU is obtained from the thermoelectric generator and 40,000 from the air-to-air exchanger 24. Only 20% is lost out the exhaust flue. Such high efficiency provides for a practical, uninterrupted gas-fired furnace having thermoelectric generating capabilities.

The electrical energy for the motor 20 and other purposes may be mounted in an inverter and control box 21 in the blower or return air chamber 12.

Figure 2:
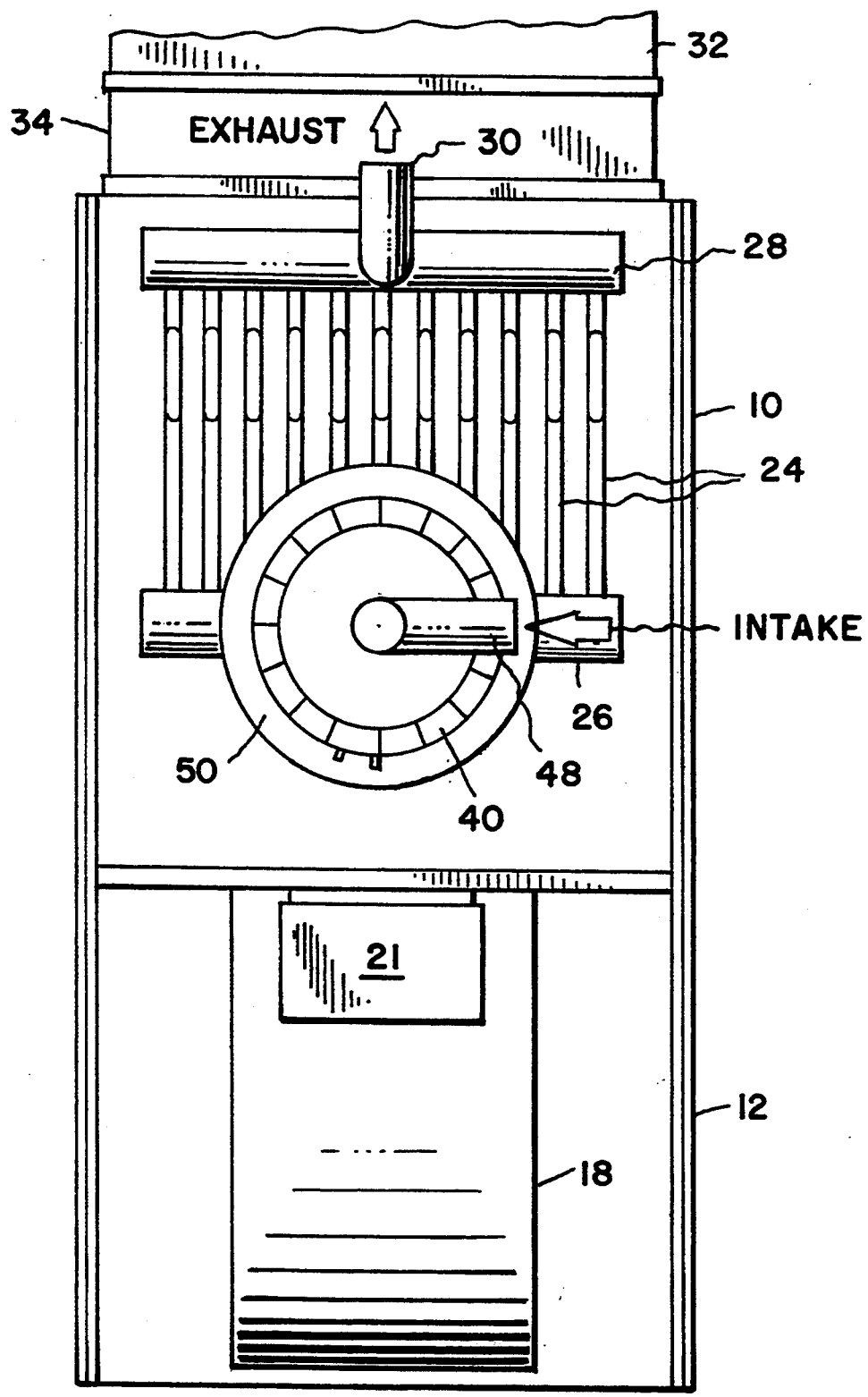
FIG. 2 is a front view of the furnace shown in FIG. 1 taken along the line 2—2 in FIG. 1.
Figure 3:
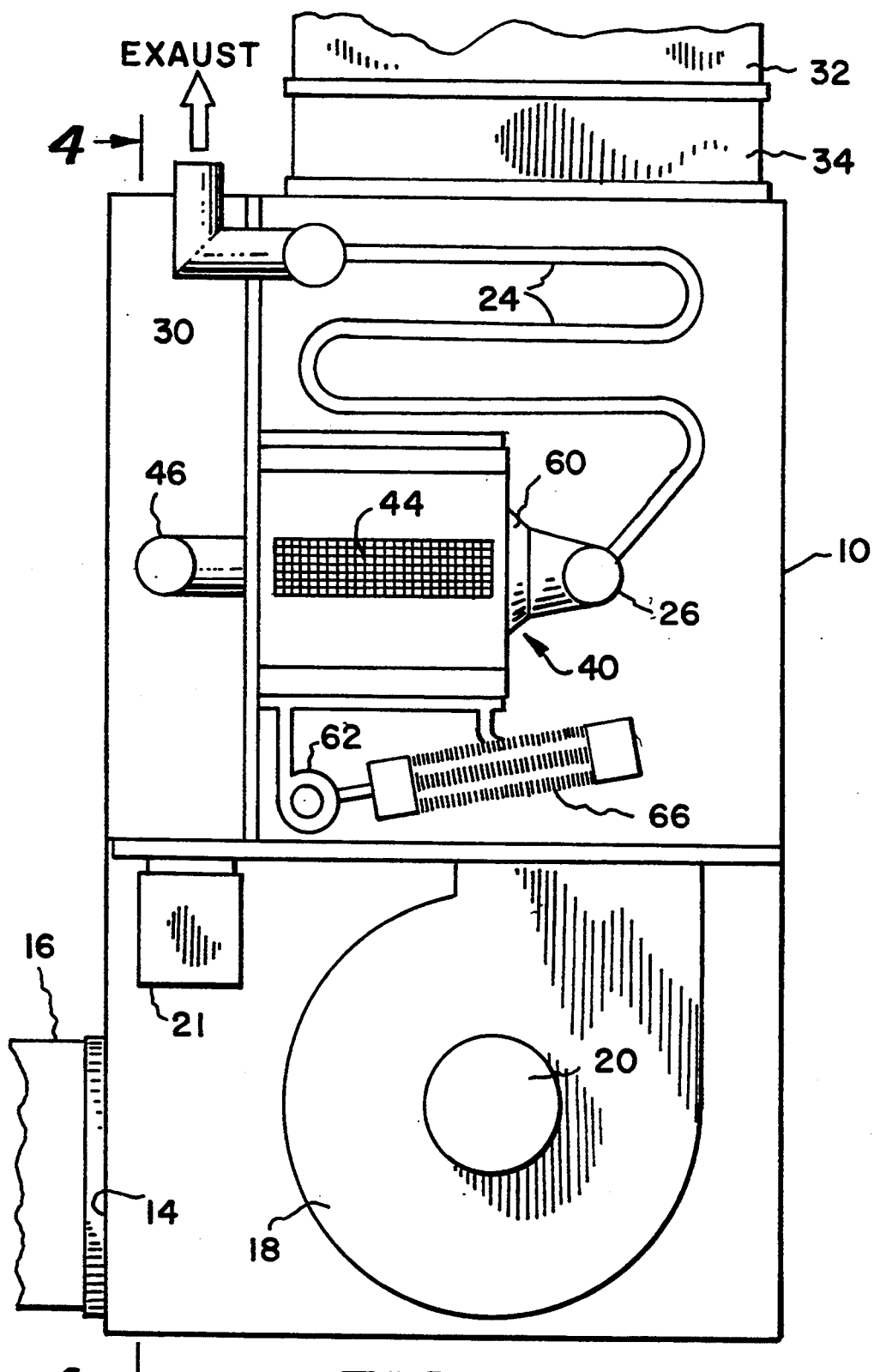
FIG. 3 is a side view with its side panel removed of a gas-fired forced air furnace in accordance with another embodiment of the invention.
Figure 4:
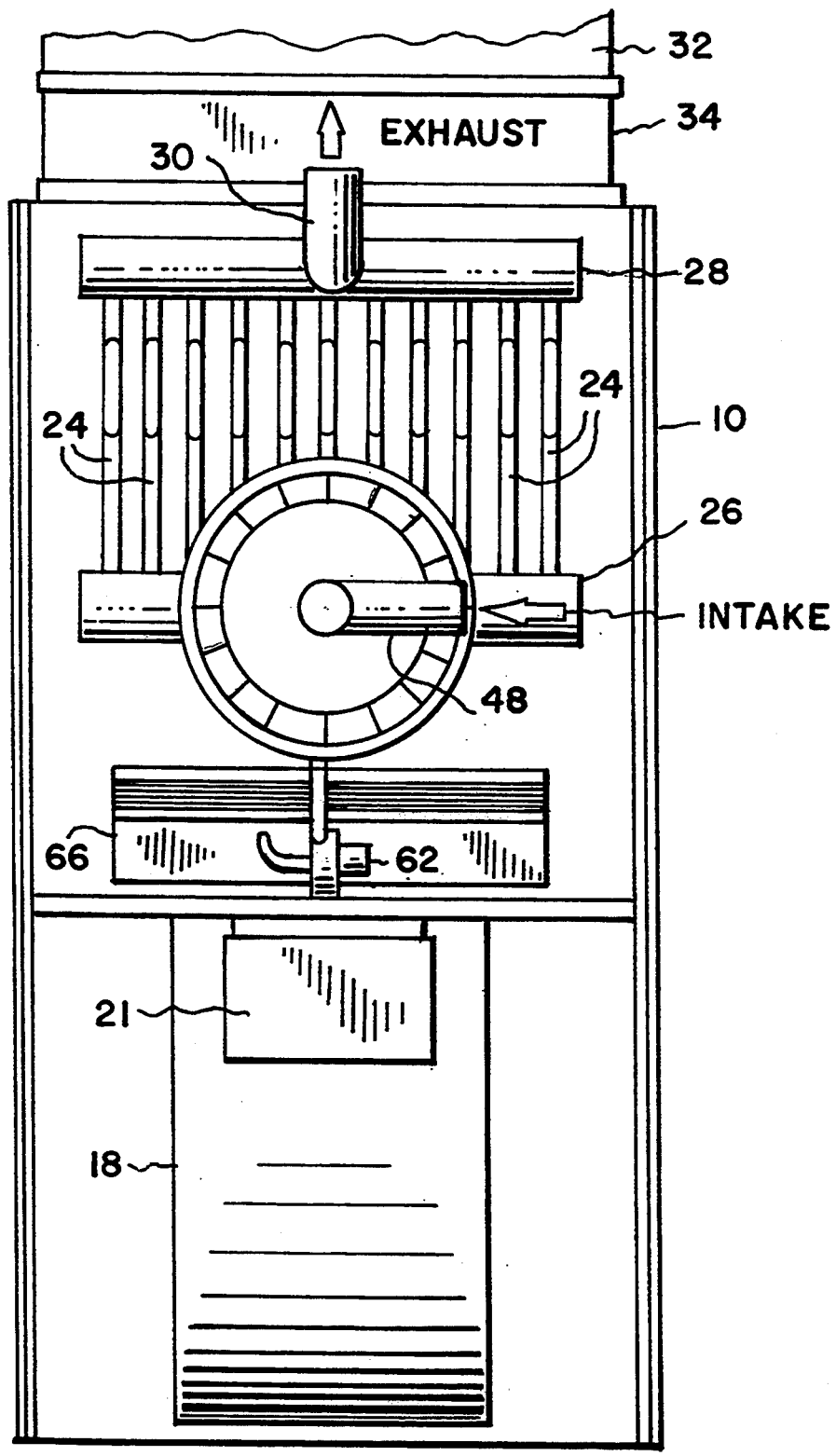
FIG. 4 is a sectional view along the line 4—4 of FIG. 3.

The gas-fired hot air furnace shown in FIGS. 3 and 4 is identical in most respects to the furnace shown in FIGS. 1 and 2 and like parts are identified by like reference numerals. The system includes a thermoelectric generator 60 which is similar to the generator 40, except that instead of the air-to-air heat exchanger provided by the fins 50, a liquid-to-air heat exchanger 66 is used. This heat exchanger includes a hydronic coil through which the cool air stream from the blower passes before reaching the air-to-air heat exchanger 24. A closed loop liquid circulation system picks up heat from the cold junction side of the generator 60 and circulates it through a pump 62 to the liquid-to-air heat exchanger 66. In an alternate configuration the liquid-to-air heat exchanger coil 66 may be placed above the T/E generator, than is between the air-to-air exchanger 24 and the generator 40.

Figure 5:
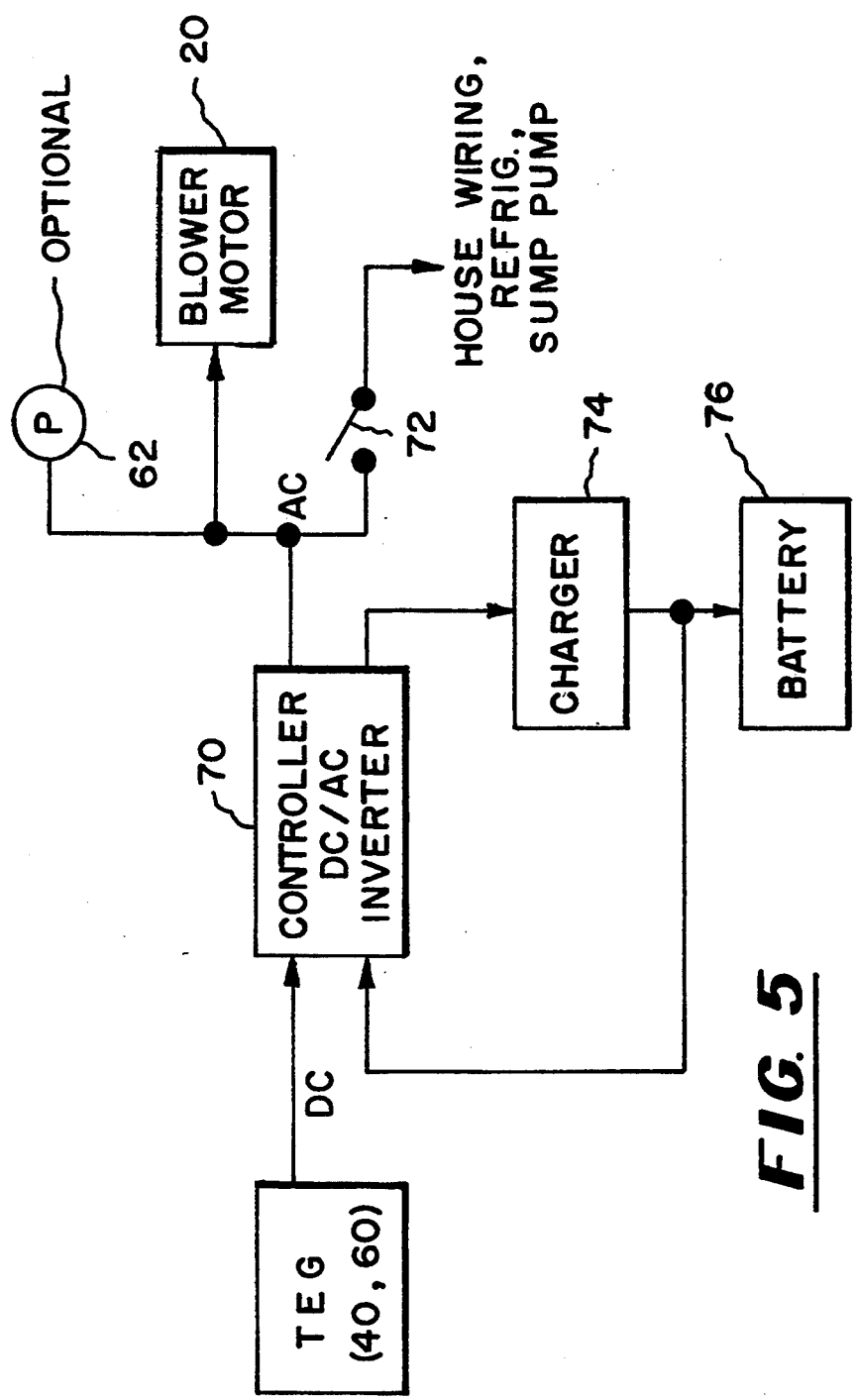
FIG. 5 is a block diagram of the electrical system of the furnaces shown in FIGS. 1 through 4.

The control system shown in FIG. 5 includes the thermoelectric generator, either 40 or 60, the leads of which are connected to a controller 70 containing switch gear and a DC to AC inverter, which inverts the DC current from the generator into AC current for operating the blower motor and the pump, and which may be connected via a switch 72 to the house wiring which goes to the refrigerator, sump pump, freezer or other appliances which require continual operation even in the face of power outages.

The inverter is connected to a battery charger 74 which charges a standby battery 76. The battery is connected back to the controller 70 and switch gear connects the battery to the motor 20 on start-up. When the furnace is in operation, the controller connects the thermoelectrically generated current, after DC to AC inversion, to the charger 74 so that the battery may be maintained charged. Alternatively and preferably the battery may be charged directly from the generator 40 as soon as the generator voltage exceeds the battery voltage. A blocking diode in the current path to the battery prevents the generator 40 from draining the battery 76 when the battery voltage exceeds the generator voltage. The peak generator voltage will be limited to a certain voltage (e.g., 28 VDC) to avoid damaging the battery 76.

From the foregoing description it will be apparent that there has been provided an improved uninterruptible forced air furnace. Variations and modifications in the herein-described furnaces and the control systems therefor will undoubtedly become apparent to those skilled in the art. Accordingly the foregoing description should be taken as illustrative and not in a limiting sense.

I claim:

1. A forced air furnace which comprises a blower which provides a stream of air, a burner which provides a stream of gaseous combustion products, a heat exchanger in which said stream of gaseous combustion products and said stream of air from said blower are in heat exchange relationship, a thermoelectric generator which generates electric current when spaced sides thereof experience a temperature differential, one of said spaced sides being in heat exchange relationship with said stream of gaseous combustion products upstream of said heat exchanger such that said stream of combustion products reaches and heats said thermoelectric generator before it reaches said heat exchanger, and another of said spaced sides being disposed in said stream of air from said blower upstream of said heat exchanger such that said stream of air from said blower reaches and is heated at said thermoelectric generator before reaching and being heated at said heat exchanger, and further comprising a liquid-to-air heat exchanger and a loop in which liquid circulates, said loop being in heat exchange relationship with said another of said spaced sides of said generator and said liquid-to-air heat exchanger, said liquid-to-air exchanger being in said stream of air from said blower upstream of the heat exchanger in which said stream of combustion products and air from said blower are in heat exchanged relationship.

2. A forced air furnace which comprises a blower which provides a stream of air, a burner which provides a stream of gaseous combustion products, a heat exchanger in which said stream of gaseous combustion products and said stream of air from said blower are in heat exchange relationship, a thermoelectric generator which generates electric current when spaced sides thereof experience a temperature differential, one of said spaced sides being in heat exchange relationship with said stream of gaseous combustion products upstream of said heat exchanger such that said stream of combustion products reaches and heats said thermoelectric generator before it reaches said heat exchanger, and another of said spaced sides being disposed in said stream of air from said blower upstream of said heat exchanger such that said stream of air from said blower reaches and is heated at said thermoelectric generator before reaching and being heated at said heat exchanger, wherein said thermoelectric generator is generally cylindrical and has an axis generally perpendicular to the stream of air and has an axis generally perpendicular to the stream of air and has an axial passage therethrough for said gaseous combustion products, an array of fins extending radially from said, another side of said generator and generally parallel to and in said stream of air, and said heat exchanger comprises a serpentine array of pipes communicating with said axial passage through which that stream of combustion product passes.

3. A forced air furnace which comprises a blower which provides a stream of air, a burner which provides a stream of gaseous combustion products, a heat exchanger in which said stream of gaseous combustion products and said stream of air from said blower are in heat exchange relationship a thermoelectric generator which generates electric current when spaced sides thereof experience a temperature differential, one of said spaced sides being in heat exchange relationship with said stream of gaseous combustion products upstream of said heat exchanger such that said stream of combustion products reaches and heats said thermoelectric generator before it reaches said heat exchanger, and wherein said thermoelectric generator is generally cylindrical and has an axial passage there through for said gaseous combustion products, and said heat exchanger comprises a serpentine array of pipes communicating with said axial passage through which said stream of combustion products passes and wherein said burner is a gas-fired burner and is disposed, at least in part, in said axial passage.

4. A forced air furnace which comprises a blower which provides a stream of air, a burner which provides a stream of gaseous combustion products, a heat exchanger in which said stream of gaseous combustion products and said stream of air from said blower are in heat exchange relationship, a thermoelectric generator which generates electric current when spaced sides thereof experience a temperature differential, one of said spaced sides being in heat exchange relationship with said stream of gaseous combustion products upstream of said heat exchanger such that said stream of combustion products reaches and heats said thermoelectric generator before it reaches said heat exchanger, further comprising a recirculating loop including a hydronic coil, said loop passing through said thermoelectric generator.

5. The furnace according to claim 4 further comprising a second heat exchanger in said stream of air, said second heat exchanger containing said hydronic coil.

6. The furnace according to claim 5 wherein said heat exchanger containing said coil is deposed upstream of said thermoelectric generator in said stream of air.

7. The furnace according to claim 5 wherein said second heat exchanger is a liquid to air heat exchanger and liquid recirculates in said loop.

* * * * *